(12) United States Patent
Peters et al.

(10) Patent No.: US 7,250,752 B2
(45) Date of Patent: Jul. 31, 2007

(54) PROBE STATION HAVING MULTIPLE ENCLOSURES

(75) Inventors: Ron A. Peters, Tigard, OR (US); Leonard A. Hayden, Beaverton, OR (US); Jeffrey A. Hawkins, Portland, OR (US); R. Mark Dougherty, Aloha, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/450,099

(22) Filed: Jun. 9, 2006

(65) Prior Publication Data

US 2006/0267610 A1    Nov. 30, 2006

Related U.S. Application Data

(63) Continuation of application No. 10/980,083, filed on Nov. 3, 2004, now Pat. No. 7,190,181, which is a continuation of application No. 10/615,724, filed on Jul. 8, 2003, now Pat. No. 6,842,024, which is a continuation of application No. 10/273,787, filed on Oct. 17, 2002, now Pat. No. 6,639,415, which is a continuation of application No. 10/013,185, filed on Dec. 7, 2001, now Pat. No. 6,489,789, which is a continuation of application No. 09/908,218, filed on Jul. 17, 2001, now Pat. No. 6,362,636, which is a continuation of application No. 09/451,698, filed on Nov. 30, 1999, now Pat. No. 6,288,557, which is a continuation of application No. 08/870,335, filed on Jun. 6, 1997, now Pat. No. 6,002,263.

(51) Int. Cl.
*G01R 31/28* (2006.01)

(52) U.S. Cl. .................................. 324/158.1

(58) Field of Classification Search ................. 324/754, 324/760, 765, 755, 758, 158.1
See application file for complete search history.

(56) References Cited

U.S. PATENT DOCUMENTS

| | | | |
|---|---|---|---|
| 5,001,423 A | 3/1991 | Abrami et al. | |
| 5,220,277 A | 6/1993 | Reitinger | |
| 5,266,889 A | 11/1993 | Harwood et al. | |
| 5,610,529 A * | 3/1997 | Schwindt | ............ 324/760 |
| 5,802,856 A | 9/1998 | Schaper et al. | |
| 5,956,837 A * | 9/1999 | Shiota et al. | ............ 29/559 |
| 6,407,560 B1 | 6/2002 | Walraven et al. | |
| 6,549,026 B1 | 4/2003 | DiBattista et al. | |
| 6,900,646 B2 | 5/2005 | Kasukabe et al. | |
| 6,900,647 B2 | 5/2005 | Yoshida et al. | |
| 6,900,652 B2 | 5/2005 | Mazur | |
| 6,900,653 B2 | 5/2005 | Yu et al. | |
| 6,902,941 B2 | 6/2005 | Sun | |
| 6,903,563 B2 | 6/2005 | Yoshida et al. | |
| 7,001,785 B1 | 2/2006 | Chen | |
| 7,002,133 B2 | 2/2006 | Beausoleil et al. | |

(Continued)

*Primary Examiner*—Ha Tran Nguyen
*Assistant Examiner*—Tung X. Nguyen
(74) *Attorney, Agent, or Firm*—Chernoff, Vilhauer, McClung & Stenzel

(57) ABSTRACT

A probe station for probing a test device has a chuck element for supporting the test device. An electrically conductive outer shield enclosure at least partially encloses such chuck element to provide EMI shielding therefor. An electrically conductive inner shield enclosure is interposed between and insulated from the outer shield enclosure and the chuck element, and at least partially encloses the chuck element.

3 Claims, 3 Drawing Sheets

U.S. PATENT DOCUMENTS

| | | |
|---|---|---|
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 2005/0227503 A1 | 10/2005 | Reitinger |
| 2006/0114012 A1 | 6/2006 | Reitinger |
| 2006/0158207 A1 | 7/2006 | Reitinger |

* cited by examiner

PROBE STATION HAVING MULTIPLE ENCLOSURES

CROSS-REFERENCE TO RELATED APPLICATIONS

This application is a continuation of application Ser. No. 10/980,083, filed Nov. 3, 2004 now U.S. Pat. No. 7,190,181, which is a continuation of application Ser. No. 10/615,724, filed Jul. 8, 2003, now U.S. Pat. No. 6,842,024, which is a continuation of application Ser. No. 10/273,787, filed Oct. 17, 2002, now U.S. Pat. No. 6,639,415, which is a continuation of application Ser. No. 10/013,185, filed Dec. 7, 2001, now U.S. Pat. No. 6,489,789, which is a continuation of application Ser. No. 09/908,218, filed Jul. 17, 2001, now U.S. Pat. No. 6,362,636, which is a continuation of application Ser. No. 09/451,698, filed Nov. 30, 1999, now U.S. Pat. No. 6,288,557, which is a continuation of application Ser. No. 08/870,335, filed Jun. 6, 1997, now U.S. Pat. No. 6,002,263.

BACKGROUND OF THE INVENTION

The present invention relates to probe stations, commonly known as package or wafer probers, used manually, semi-automatically or fully automatically to test semiconductor devices. More particularly, the invention relates to such probe stations having EMI shielded enclosures for substantially enclosing the test devices, such as those probe stations shown in commonly-owned U.S. Pat. Nos. 5,266,889 and 5,457,398 which are hereby incorporated by reference.

The probe stations shown in the foregoing patents are capable of performing both low-current and high-frequency measurements within a single shielded enclosure. However, as electrical test currents decrease, or as electrical test frequencies increase, the use of merely a single EMI shielding enclosure becomes less adequate. In the most sensitive of measurements, and particularly (although not necessarily) when guarding is employed for low current measurements as described in U.S. Pat. No. 5,457,398, the choice of the shield potential is critical. Reflecting such criticality, the single shield enclosures shown in the foregoing patents have in the past been equipped with selective connectors enabling the shield potential to match that of the measurement instrumentation ground while being isolated from other connectors, or alternatively to be biased by another connector, or to be connected to AC earth ground. Usually the measurement instrumentation ground is preferred since it provides a "quiet" shield ideally having no electrical noise relative to the measurement instrument. However, if the shielding enclosure is exposed to EMI (such as electrostatic noise currents from its external environment), its ideal "quiet" condition is not achieved, resulting in unwanted spurious currents in the chuck assembly guard element and/or the supporting element for the test device. The effect of such currents is particularly harmful to the operation of the guard element, where the spurious currents result in guard potential errors causing leakage currents and resultant signal errors in the chuck element which supports the test device.

For high-frequency measurements, guarding is typically not employed. However, for the most sensitive of measurements, the "quietness" of the shield is still critical. For this reason, it is common practice to construct a fully shielded room, commonly known as a screen room, large enough to contain a probe station with its own separate shield enclosure, test equipment, and several operators. However, screen rooms take up a large amount of space, are expensive to build, and are ineffective with respect to noise sources within the room.

The environmental influences which ordinarily compromise the desired quiet condition of a shield are the motion of external objects at constant potential which cause spurious shield currents due to varying capacitance, and external AC voltages which cause spurious shield currents via constant capacitance. For sensitive measurements, what is needed is a truly quiet shield unaffected by such environmental influences.

Also, to reduce the need for a screen room, and provide a shield unaffected by closely adjacent environmental influences, such quiet shield structure should be compact.

BRIEF SUMMARY OF THE INVENTION

The present invention satisfies the foregoing need by providing a probe station having respective inner and outer conductive shield enclosures insulated from each other, both enclosures at least partially enclosing the chuck assembly element which supports the test device, and also its associated guard element if one is provided. The outer shield enclosure, which is preferably connected either directly or indirectly to AC earth ground, intercepts the external environmental noise, minimizing its effects on the inner shield and on the chuck assembly elements enclosed by the inner shield.

Such inner and outer shield enclosures are preferably built integrally into the probe station and therefore are compact.

The foregoing and other objectives, features, and advantages of the invention will be more readily understood upon consideration of the following detailed description, taken in conjunction with the accompanying drawings.

DETAILED DESCRIPTION OF PREFERRED EMBODIMENT

Figure 1:
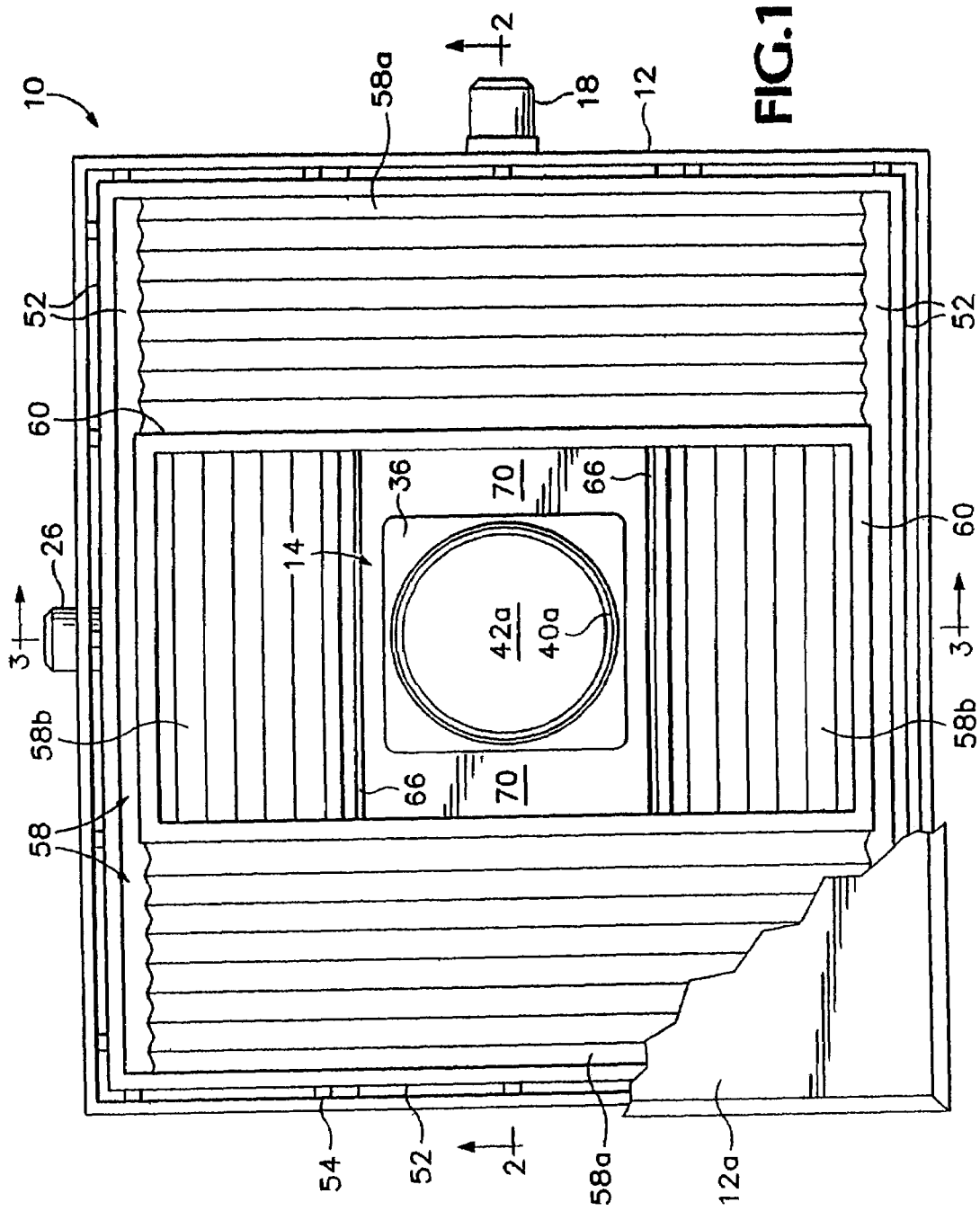
FIG. 1 is a top view of an exemplary probe station in accordance with the present invention, with the top of the station partially removed to show interior structure.

An exemplary embodiment of a probe station in accordance with the present invention, indicated generally as 10 in the figures, has an electrically conductive outer enclosure 12 including a conductive raisable hinged lid 12a electrically connected thereto. A chuck assembly 14 for supporting a test device is laterally positionable by a chuck positioner assembly having orthogonally arranged lateral X-axis and Y-axis positioners. A lateral X-axis positioner 16 has a laterally extending positioning screw (not shown) driven by an electric motor 18. The X-axis positioner 16 is partially enclosed by a conductive housing 16a, and optionally also by flexible pleated rubber boots 16b for accommodating positioning movements while preventing the entry and escape of dirt particles. The conductive housing 16a is insulated from the outer enclosure 12 by respective dielectric anodized coatings on both the exterior of the housing 16a and the interior of the enclosure 12, and is indirectly connected electrically to AC earth ground by means of conventional motor cabling and a grounded motor power supply (not shown), represented schematically in FIG. 2 by a high-impedance electrical path 22. The X-axis positioner 16 selectively moves a Y-axis positioner 24, oriented perpendicularly to the X-axis positioner 16, along the X-axis.

Figure 3:
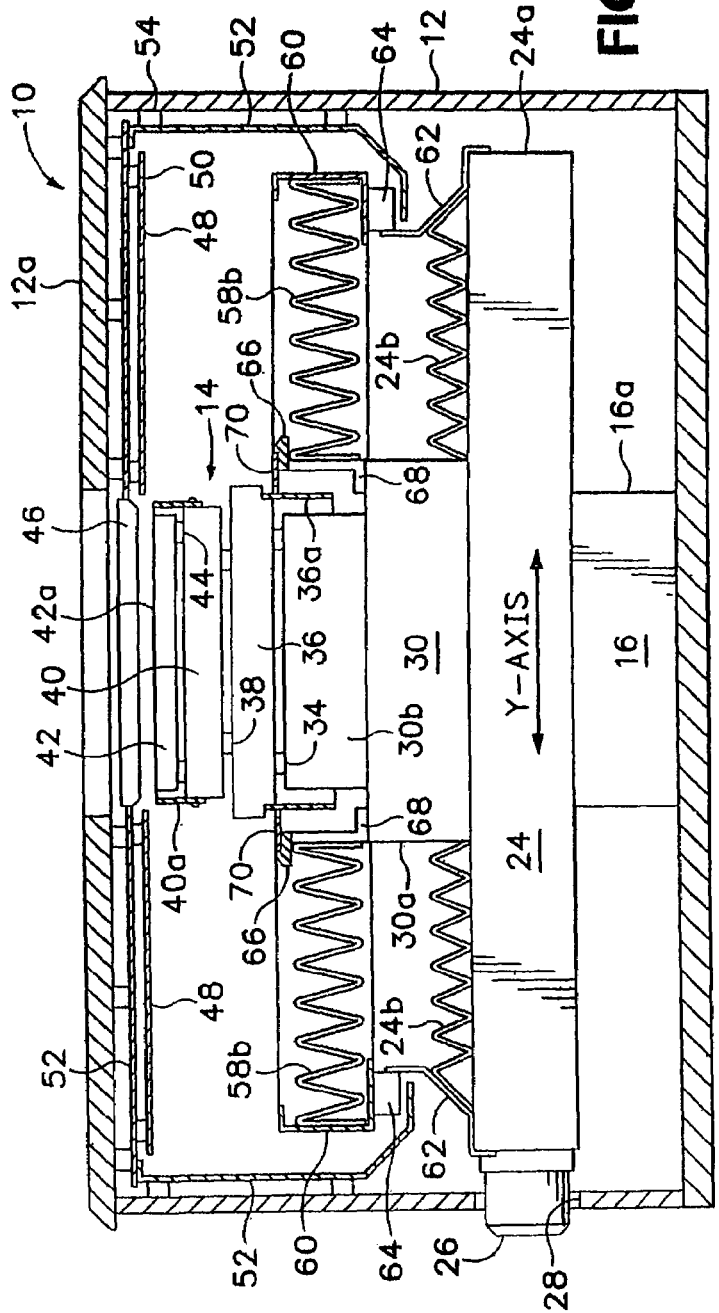
FIG. 3 is a partially sectional, partially schematic view taken along line 3—3 of FIG. 1.

The lateral Y-axis positioner 24 is constructed similarly to the X-axis positioner 16, and includes an outer conductive housing 24a with optional flexible pleated rubber boots 24b. The conductive housing 24a is electrically connected to the housing 16a of the X-axis positioner. The motor 26 of the Y-axis positioner 24 extends through a horizontal slot 28 (FIG. 3) in the side of the enclosure 12, thereby permitting it to be moved freely along the X-axis by the X-axis positioner 16. Alternatively, a larger enclosure 12 could eliminate the slot 28.

A conventional Z-axis positioner 30, having a conductive housing 30a electrically connected to the housing 24a, is movable along the Y-axis by the Y-axis positioner 24. The Z-axis positioner 30 includes respective internal electric motors (not shown) which selectively reciprocate a plunger assembly 30b vertically and rotate it through a limited range about a vertical axis in a known manner.

The outer conductive enclosure 12 is connected by a low-impedance path 32 (FIG. 2) directly to AC ground. Collectively, the outer enclosure 12, 12a and the positioner housings 16a, 24a, and 30a cooperate to provide an electrically conductive outer shield enclosure which separates the remainder of the probe station from environmental noise sources, whether located externally of the enclosure 12 or internally thereof inside the positioner housings. Such noise sources include the electric motors 18 and 26, and those motors within the Z-axis positioner 30, as well as other electrical components such as cables, thermal heaters, encoders, switches, sensors, etc.

Mounted atop the plunger assembly 30b and electrically insulated therefrom by dielectric spacers 34 is a square-shaped conductive chuck shield 36 having a downwardly depending conductive cylindrical skirt 36a. Mounted atop the chuck shield 36 and electrically insulated therefrom by dielectric spacers 38 is a conductive chuck guard element 40, which includes a peripheral cylindrical conductive guard skirt 40a. The guard skirt 40a peripherally surrounds a conductive chuck element 42 in spaced relation thereto. The chuck element 42 is insulated from the guard element 40 and guard skirt 40a by dielectric spacers 44 and has a supporting surface 42a thereon for supporting a test device during probing. Probes (not shown) are mounted on a probe ring 46, or other suitable type of probe holder, for contacting the test device when the Z-axis positioner 30 raises the supporting surface 42a upwardly into probing position.

Figure 2:
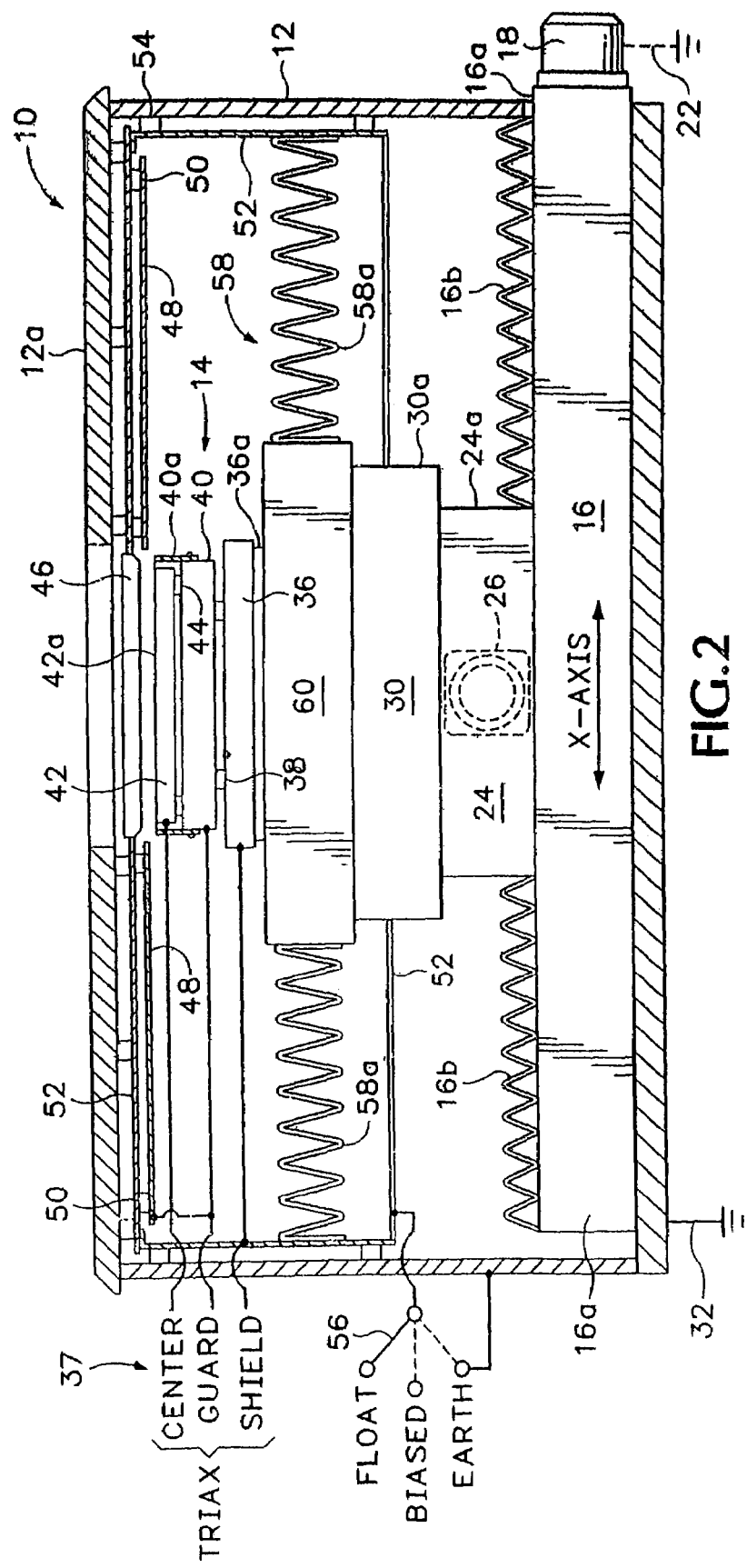
FIG. 2 is a partially sectional, partially schematic view taken along line 2—2 of FIG. 1.

As shown schematically in FIG. 2, the chuck shield 36 is electrically connected to the shield of a triaxial cable 37 interconnected with the measurement instrumentation. The guard element 40, together with the guard skirt 40a, is connected to the guard conductor of the triaxial cable, and the chuck element 42 is connected to the center or signal conductor of the triaxial cable 37. Preferably a further guard element in the form of a conductive plate 48, also electrically connected to the guard conductor of the triaxial cable and insulated from the remainder of the probe station by dielectric spacers 50, is suspended in opposed relationship to the supporting surface 42a. The conductive plate 48 also provides a connection to a guard element on the bottom of a probe card (not shown). Further details of the electrical connections, and of the dielectric spacers utilized to insulate the chuck elements from each other, are explained in U.S. Pat. No. 5,457,398 which is incorporated herein by reference. As explained in such patent, the connections to the chuck elements 40 and 42 cause such elements to have substantially equal potentials to minimize leakage currents therebetween.

An electrically conductive inner shield enclosure 52, which also preferably acts as the probe station's environment control enclosure not only for purposes of EMI shielding but also for purposes of maintaining a dry and/or dark environment, is mounted by dielectric spacers 54 to the interior of the outer enclosure 12 so as to be interposed between and insulated from the outer enclosure 12 and the chuck elements 40 and 42. Like the chuck shield 36, the enclosure 52 is connected to the shield of the triaxial cable 37 associated with the measurement instrumentation. A selective connector mechanism, schematically illustrated as a three-way switch 56 in FIG. 2, enables respective different potentials to be selectively established on the enclosure 52. Normally the selective mechanism 56 would be in the "float" position whereby the potential of the enclosure 52 depends on the triaxial shield associated with the measurement instrumentation. However the enclosure 52 can alternatively be electrically biased by the selective connector mechanism 56, or interconnected with the outer enclosure 12 if desired for particular applications. In the normal situation where the inner enclosure 52 is not electrically connected to the outer enclosure 12, the outer shield components 12, 12a, 16a, 24a, and 30a protect the inner shield 52 from external noise sources, so that the inner shield in turn can minimize noise-induced spurious currents affecting the chuck elements 40 and/or 42 and thereby maximize the accuracy of the test measurements.

Movement of the chuck assembly 14 laterally by the X-axis and Y-axis positioners 16 and 24, respectively, is accomplished with the Z-axis positioner retracted in order to position the test device with respect to the probe or probes. During such movement, the environmental integrity of the inner enclosure 52 is maintained by means of an electrically conductive flexible wall assembly indicated generally as 58. The wall assembly 58 includes a pair of flexibly extensible and retractable pleated wall elements 58a which are extensible and retractable along the X-axis, and a further pair of such wall elements 58b which are flexibly extensible and retractable along the Y-axis. The outermost ends of the wall elements 58a are electrically connected to the inner surfaces of the inner enclosure 52 by screws (not shown). The innermost ends of the wall elements 58a are similarly connected to a rectangular metal frame 60 supported by the Y-axis positioner housing 24a by means of brackets 62 (FIG. 3) and dielectric spacers 64 which insulate the frame 60 from the Y-axis positioner housing 24a. The outermost ends of the flexible wall elements 58b, on the other hand, are electrically connected to the inner surfaces of the ends of the frame 60 by screws (not shown), while their innermost ends are similarly connected to respective conductive bars 66 insulatively supported by dielectric brackets 68 atop the Z-axis positioner housing 30a. Conductive plates 70 are electrically connected to the bars 66 and surround the chuck shield skirt 36a in spaced relation thereto.

As the X-axis positioner 16 moves the Y-axis positioner 24 and chuck assembly along the X-axis, it likewise moves the frame 60 and its enclosed wall elements 58b along the X-axis as the wall elements 58a extend and retract. Conversely, as the Y-axis positioner 24 moves the Z-axis positioner and chuck assembly along the Y-axis, the wall elements 58b similarly extend and retract along the Y-axis.

Figure 4:
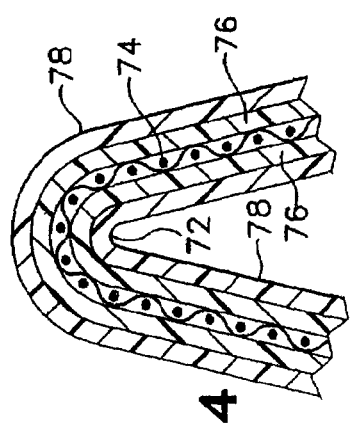
FIG. 4 is an enlarged sectional view of a portion of a flexible wall element of the embodiment of FIG. 1.

With reference to FIG. 4, a cross-section of an exemplary pleat 72 of the flexible wall elements 58a and 58b is shown. The electrically conductive core 74 of the pleated material is a fine mesh polyester, chemically coated with copper and nickel. The core 74 is sandwiched between respective layers 76 which are nylon fabric with a PVC stiffener. The respective layers 76 in turn are covered by respective outer layers 78 of polyurethane. The pleated material is preferably fluid-impervious and opaque so that the inner enclosure 52 can serve as a dry and/or dark environment control chamber, as well as an EMI shield. However, if the inner enclosure 52 were merely intended to serve as a shield, the pleated material need not be fluid-impervious or opaque. Conversely, if the inner enclosure 52 were intended to serve merely as an environment control chamber for dry and/or dark purposes, without EMI shielding, the pleated material's conductive core 74 could be eliminated. Also, alternative pleated materials of other compositions, such as thin, highly flexible stainless steel or other all-metal sheet material, could be used.

Figure 5:
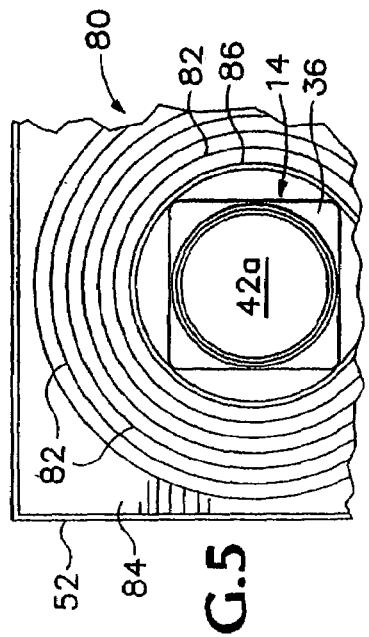
FIG. 5 is a partial top view of an alternative embodiment of the invention.

As a further alternative, a one-piece flexible wall assembly 80 (FIG. 5) having circular or oblate curved rings of pleats 82 surrounding the chuck assembly 14 could be provided in place of the wall assembly 58 to permit flexible extension and retraction in radial X and Y directions. The outer extremity of the wall assembly 80 is electrically connected by a curved conductive frame 84 to the inner shield enclosure 52. The inner extremity of the wall assembly 80 is supported by a circular conductive ring 86, and an underlying circular dielectric bracket (not shown) comparable to bracket 68, upon the Z-axis positioner housing 30a.

As a further alternative, the inner enclosure 52 could utilize conductive or nonconductive sliding plates, such as those shown in U.S. Pat. No. 5,457,398 incorporated herein by reference, in place of the flexible wall assembly 58 if the more desirable characteristics of the flexible wall assembly are not needed. As a still further alternative, unpleated flexibly extensible and retractable material could be used instead of pleated material in the wall assembly 58.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A probe station for probing a test device, said probe station comprising:
   (a) a chuck for supporting said test device;
   (b) a plurality of electrically conductive members, each electrically isolated from said chuck and at least one of said plurality of electrically conductive members at least partially surrounding said chuck, and at least one of said plurality of electrically conductive members at least partially surrounding another of said plurality of electrically conductive members; and
   (c) a selector member capable of alternately:
      (i) electrically isolating said electrically conductive members from each other; and
      (ii) electrically interconnecting one said conductive member with at least one other said conductive member.

2. The probe station of claim 1 having only two said conductive members.

3. The probe station of claim 1 including an outer conductive member at least partially surrounding at least one other said conductive member.

* * * * *